(12) United States Patent
Ikeda

(10) Patent No.: US 10,581,316 B2
(45) Date of Patent: Mar. 3, 2020

(54) SEMICONDUCTOR DEVICE, POWER CONVERTING DEVICE, DRIVING DEVICE, VEHICLE, AND ELEVATOR

(71) Applicant: Kabushiki Kaisha Toshiba, Minato-ku (JP)

(72) Inventor: Kentaro Ikeda, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 95 days.

(21) Appl. No.: 15/889,414

(22) Filed: Feb. 6, 2018

(65) Prior Publication Data

US 2018/0375423 A1 Dec. 27, 2018

(30) Foreign Application Priority Data

Jun. 26, 2017 (JP) .................................. 2017-124199

(51) Int. Cl.
*B60L 1/00* (2006.01)
*B60L 3/00* (2019.01)
(Continued)

(52) U.S. Cl.
CPC ............... *H02M 1/32* (2013.01); *B60L 3/003* (2013.01); *B60L 15/007* (2013.01); *B66B 11/043* (2013.01); *H01L 27/0248* (2013.01); *H01L 27/0288* (2013.01); *H01L 27/0629* (2013.01); *H02M 1/08* (2013.01); *H02M 7/537* (2013.01);
(Continued)

(58) Field of Classification Search
CPC .... B60L 15/007; B60L 3/003; B60L 2210/40; B60L 2240/527; B60L 50/51; B66B 11/043; H01L 27/0248; H01L 27/0288; H01L 27/0629; H01L 28/20; H01L 28/60; H01L 29/78; H01L 29/861; H02M 1/08; H02M 1/32; H02M 7/537; H02M 2001/0029; H02M 7/5387; H02P 27/06
USPC ................ 307/9.1, 10.1; 323/271, 281, 282; 320/162; 318/109, 139
See application file for complete search history.

(56) References Cited

U.S. PATENT DOCUMENTS 9,136,767 B2 9/2015 Sugahara et al.
2016/0043641 A1* 2/2016 Nishimura ............... H02M 1/08
                                                          323/271
2017/0353128 A1 12/2017 Ikeda et al.

FOREIGN PATENT DOCUMENTS

JP       63-171371       7/1988
JP        2595162        3/1999
(Continued)

*Primary Examiner* — Rexford N Barnie
*Assistant Examiner* — Toan T Vu
(74) *Attorney, Agent, or Firm* — Oblon, McClelland, Maier & Neustadt, L.L.P.

(57) ABSTRACT

A semiconductor device of an embodiment includes a first diode having a first anode and a first cathode, the first anode connected to either one of first and second electrodes of a first transistor having the first and second electrodes and a first gate electrode; a first electric resistor having a first one end connected to the first cathode and a first other end connected to positive pole of a direct-current power source; a first capacitor having a second one end and a second other end connected to the first cathode; a second capacitor having a third one end connected to negative pole of the direct-current power source and a third other end connected to the second one end of the first capacitor; and a second switching element connected in parallel to the second capacitor.

16 Claims, 12 Drawing Sheets

(51) Int. Cl.
  *H02G 3/00* (2006.01)
  *H02M 1/32* (2007.01)
  *H01L 27/06* (2006.01)
  *H01L 27/02* (2006.01)
  *H02M 7/537* (2006.01)
  *B66B 11/04* (2006.01)
  *H02M 1/08* (2006.01)
  *B60L 15/00* (2006.01)
  *H01L 29/861* (2006.01)
  *H01L 49/02* (2006.01)
  *H01L 29/78* (2006.01)
  *H02P 27/06* (2006.01)
  *H02M 1/00* (2006.01)
  *B60L 50/51* (2019.01)
  *H02M 7/5387* (2007.01)

(52) U.S. Cl.
  CPC ........... *B60L 50/51* (2019.02); *B60L 2210/40* (2013.01); *B60L 2240/527* (2013.01); *H01L 28/20* (2013.01); *H01L 28/60* (2013.01); *H01L 29/78* (2013.01); *H01L 29/861* (2013.01); *H02M 7/5387* (2013.01); *H02M 2001/0029* (2013.01); *H02P 27/06* (2013.01)

(56) References Cited

FOREIGN PATENT DOCUMENTS

| | | |
|---|---|---|
| JP | 2000-209854 | 7/2000 |
| JP | 2014-090625 | 5/2014 |
| JP | 2017-221004 | 12/2017 |

* cited by examiner

SEMICONDUCTOR DEVICE, POWER CONVERTING DEVICE, DRIVING DEVICE, VEHICLE, AND ELEVATOR

CROSS-REFERENCE TO RELATED APPLICATION

This application is based upon and claims the benefit of priority from Japanese Patent Application No. 2017-124199, filed on Jun. 26, 2017, the entire contents of which are incorporated herein by reference.

FIELD

Embodiments described herein relate generally to a semiconductor device, a power converting device, a driving device, a vehicle, and an elevator.

BACKGROUND

With a power transistor that performs high-speed switching operation, a surge voltage may be generated due to a parasitic inductance when the power transistor is turned off. The generation of the surge voltage is disadvantageous, since the surge voltage may cause breakdown of a gate insulating film and/or ringing in a circuit. Since the surge voltage is high and is generated for a short time period, detection of the surge voltage is difficult.

DETAILED DESCRIPTION

Figure 1:
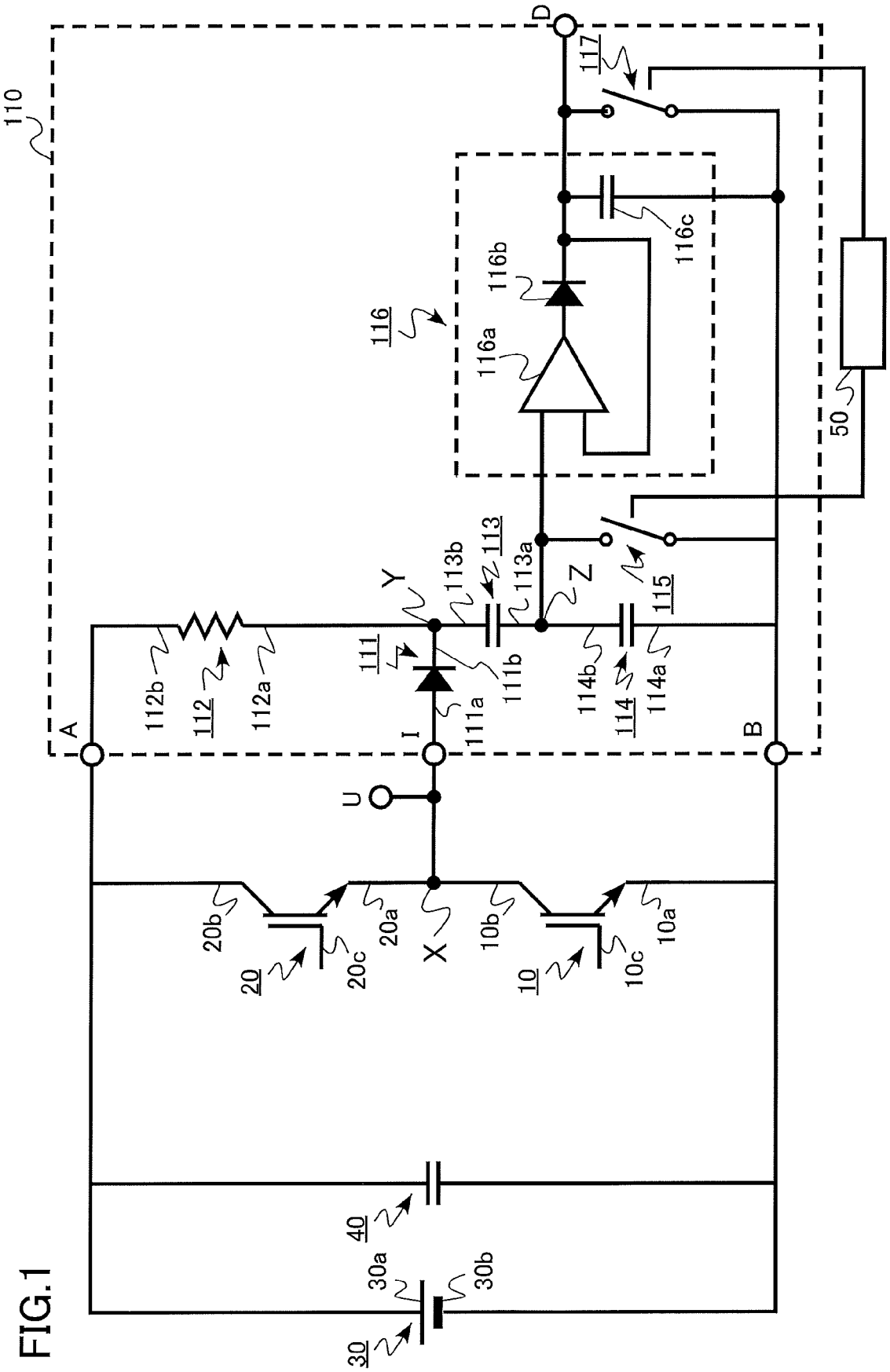
FIG. 1 is a circuit diagram of a semiconductor device according to a first embodiment.

A semiconductor device according to an embodiment of the present disclosure includes: a first diode having a first anode and a first cathode, the first anode being electrically connected to either one of a first electrode and a second electrode of a first transistor having the first electrode, the second electrode, and a first gate electrode; a first electric resistor or a first switching element having a first one end and a first other end, the first one end being electrically connected to the first cathode, the first other end being electrically connected to a positive pole of a direct-current power source having the positive pole and a negative pole; a first capacitor having a second one end and a second other end, the second other end being electrically connected to the first cathode; a second capacitor having a third one end and a third other end, the third one end being electrically connected to the negative pole, the third other end being electrically connected to the second one end of the first capacitor; and a second switching element electrically connected between the third one end and the third other end of the second capacitor in parallel to the second capacitor.

Embodiments of the present disclosure will be described below with reference to the drawings. Note that, in the following description, identical or similar members and the like are given identical reference numbers, and a description of the members and the like having been described once is omitted as appropriate.

The "semiconductor device" herein is a concept encompassing an integrated circuit (IC) including a plurality of elements formed in a single chip, an electronic circuit board on which a plurality of electronic parts are disposed, or a power module made by a combination of a plurality of elements such as discrete semiconductors.

First Embodiment

A semiconductor device according to the present embodiment includes: a first diode having a first anode and a first cathode, the first anode being electrically connected to either one of a first electrode and a second electrode of a first transistor having the first electrode, the second electrode, and a first gate electrode; a first electric resistor or a first switching element having a first one end and a first other end, the first one end being electrically connected to the first cathode, the first other end being electrically connected to a positive pole of a direct-current power source having the positive pole and a negative pole; a first capacitor having a second one end and a second other end, the second other end being electrically connected to the first cathode; a second capacitor having a third one end and a third other end, the third one end being electrically connected to the negative pole, the third other end being electrically connected to the second one end of the first capacitor; and a second switching element electrically connected between the third one end and the third other end of the second capacitor in parallel to the second capacitor.

A power converting device according to the present embodiment includes: a first transistor having a first electrode, a second electrode, and a first gate electrode; a first diode having a first anode and a first cathode, the first anode being electrically connected to either one of the first electrode and the second electrode; a first electric resistor or a first switching element having a first one end and a first other end, the first one end being electrically connected to the first cathode, the first other end being electrically connected to a positive pole of a direct-current power source having the positive pole and a negative pole; a first capacitor having a second one end and a second other end, the second other end being electrically connected to the first cathode; a second capacitor having a third one end and a third other end, the third one end being electrically connected to the negative pole, the third other end being electrically connected to the second one end of the first capacitor; and a second switching element electrically connected between the third one end and the third other end of the second capacitor in parallel to the second capacitor.

FIG. 1 is a circuit diagram of a semiconductor device according to the present embodiment. The semiconductor device according to the present embodiment is a surge-voltage detection circuit 110.

Figure 2:
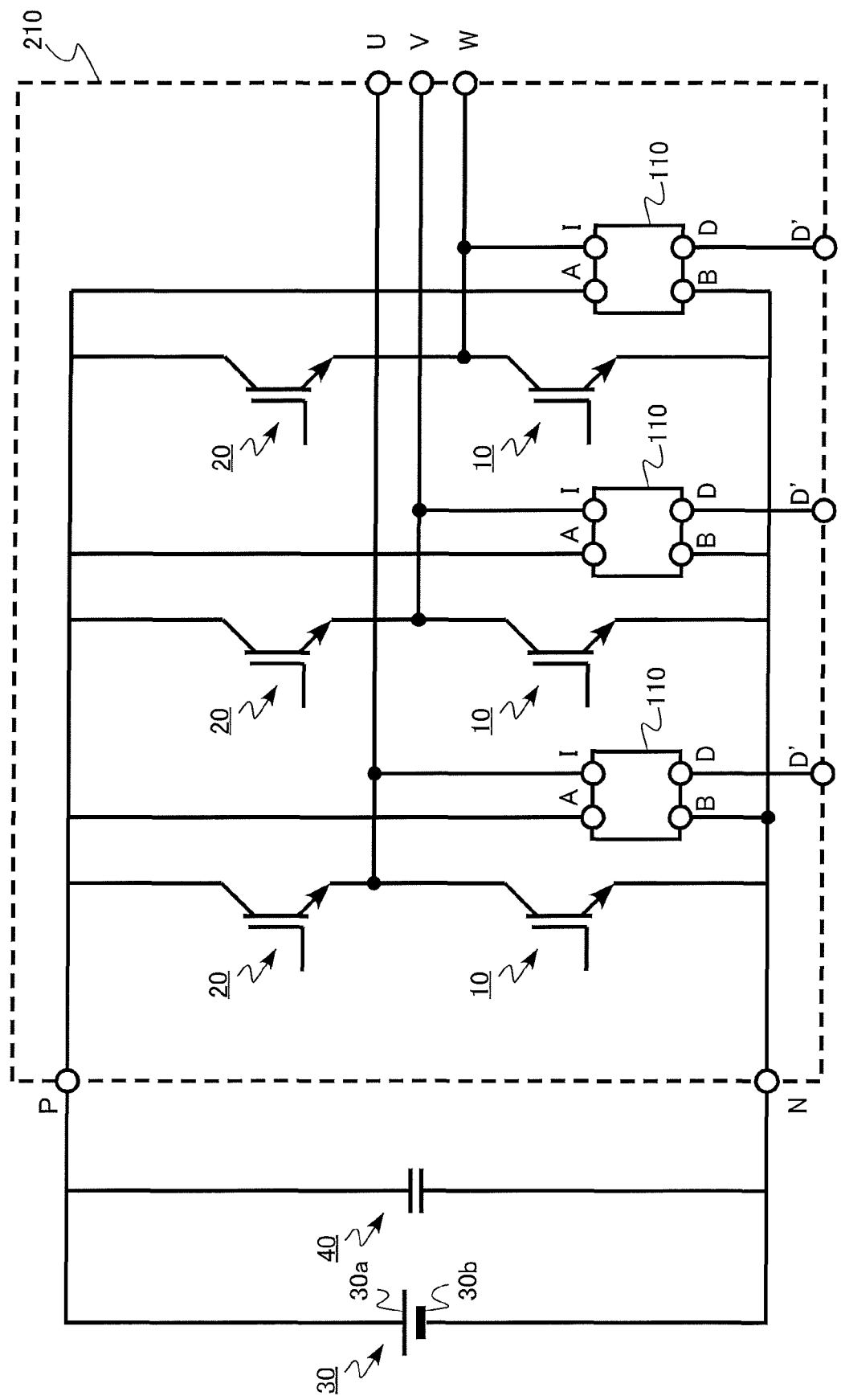
FIG. 2 is a circuit diagram of a power converting device according to the first embodiment.

FIG. 2 is a circuit diagram of a power converting device according to the present embodiment. The power converting device according to the present embodiment is an inverter circuit 210 including the surge-voltage detection circuits 110.

FIG. 1 shows a part of the inverter circuit 210. FIG. 1 shows details of a configuration of one of the surge-voltage detection circuits 110.

The inverter circuit 210 shown in FIG. 2 includes three sets of low-side transistors 10 (first transistors) and high-side transistors 20, the three surge-voltage detection circuits 110, a positive terminal P, a negative terminal N, an output terminal U, an output terminal V, an output terminal W, and detection terminals D'. The positive terminal P is connected to a positive pole 30a of a direct-current power source 30, and the negative terminal N is connected to a negative pole 30b of the direct-current power source 30. For example, a smoothing capacitor 40 is provided between the positive terminal P and the negative terminal N in parallel to the direct-current power source 30. The inverter circuit 210 is a three-phase inverter. Each of the detection terminals D' outputs a surge-voltage detection result from a respective one of the surge-voltage detection circuits 110.

A voltage of the direct-current power source 30 is, for example, 200 V or more and 1500 V or less.

Each of the low-side transistors 10 and the high-side transistors 20 is, for example, an insulated gate bipolar transistor (IGBT). To the low-side transistors 10 and the high-side transistors 20, freewheel diodes (not illustrated) are connected, for example.

Each of the surge-voltage detection circuits 110 is, for example, an IC including a plurality of elements formed in a single chip or an electronic circuit board on which a plurality of electronic parts are disposed. Each of the surge-voltage detection circuit 110 detects a surge voltage generated between a respective one of the low-side transistors 10 and a respective one of the high-side transistors 20.

FIG. 1 shows, from among the three sets of low-side transistors 10 and high-side transistors 20 in the inverter circuit 210, one set of low-side transistor 10 and high-side transistor 20 that are connected to the output terminal U. FIG. 1 also shows one of the surge-voltage detection circuits 110 connected to the one set of low-side transistor 10 and high-side transistor 20.

The surge-voltage detection circuit 110 includes a diode 111 (first diode), an electric resistor 112 (first electric resistor), a capacitor 113 (first capacitor), a capacitor 114 (second capacitor), a switching element 115 (second switching element), a sample-and-hold circuit 116, a switching element 117, an input terminal A, an input terminal B, an input terminal I, and a detection terminal D.

The low-side transistor 10 of the inverter circuit 210 has an emitter electrode 10a (first electrode), a collector electrode 10b (second electrode), and a gate electrode 10c (first gate electrode). The high-side transistor 20 of the inverter circuit 210 has an emitter electrode 20a, a collector electrode 20b, and a gate electrode 20c.

The input terminal A of the surge-voltage detection circuit 110 is electrically connected to the positive pole 30a of the direct-current power source 30. The input terminal B of the surge-voltage detection circuit 110 is electrically connected to the negative pole 30b of the direct-current power source 30.

The input terminal I of the surge-voltage detection circuit 110 is electrically connected to the collector electrode 10b of the low-side transistor 10 and to the emitter electrode 20a of the high-side transistor 20. The input terminal I is electrically connected to a position in the electric circuit where a surge voltage may be generated.

The detection terminal D of the surge-voltage detection circuit 110 outputs a surge-voltage detection result.

The diode 111 has an anode 111a (first anode) and a cathode 111b (first cathode). The input terminal I is electrically connected to the anode 111a. The anode 111a is electrically connected to the collector electrode 10b of the low-side transistor 10 and to the emitter electrode 20a of the high-side transistor 20.

The electric resistor 112 has an end 112a (first one end) and an end 112b (first other end). The end 112a is electrically connected to the cathode 111b of the diode 111. The end 112b is electrically connected to the positive pole 30a of the direct-current power source 30 via the input terminal A. The electric resistor 112 has a function to reset a voltage increase at position Y caused by a surge voltage.

The capacitor 113 has an end 113a (second one end) and an end 113b (second other end). The end 113b is electrically connected to the cathode 111b of the diode 111.

The capacitor 114 has an end 114a (third one end) and an end 114b (third other end). The end 114a is electrically connected to the negative pole 30b of the direct-current power source 30 via the input terminal B. The end 114b is electrically connected to the end 113a of the capacitor 113.

A capacitance of the capacitor 114 is greater than a capacitance of the capacitor 113, for example. The capacitance of the capacitor 114 is ten times or more the capacitance of the capacitor 113, for example.

The switching element 115 is electrically connected between the end 114a and the end 114b of the capacitor 114 in parallel to the capacitor 114. The switching element 115 is, for example, a transistor. The switching element 115 has a function to reset a voltage (at position Z in FIG. 1) between the capacitors 113 and 114 to a potential at the negative pole 30b of the direct-current power source 30.

The sample-and-hold circuit 116 includes an operational amplifier 116a, a diode 116b, and a capacitor 116c. The sample-and-hold circuit 116 has a function to maintain, for a predetermined time period, a peak value of a voltage inputted to the operational amplifier 116a. A configuration of the sample-and-hold circuit 116 is not limited to the configuration shown in FIG. 1, as long as the sample-and-hold circuit 116 has a function to maintain the peak value for a predetermined time period.

The switching element 117 is electrically connected parallel to the capacitor 116c. The switching element 117 is, for example, a transistor. The switching element 117 has a function to reset a voltage at an output side of the sample-and-hold circuit 116 to a potential at the negative pole 30b of the direct-current power source 30.

Turning on/off of the switching elements 115 and 117 is controlled by, for example, a switching controller 50. The switching controller 50 is, for example, a microcomputer. The switching controller 50 is provided outside the surge-voltage detection circuit 110, for example.

Next, operation and effects of the semiconductor device and the power converting device according to the present embodiment will be described.

With a power transistor that performs high-speed switching operation, a surge voltage may be generated due to a parasitic inductance when the power transistor is turned off. The generation of the surge voltage is disadvantageous, since the surge voltage may cause breakdown of a gate insulating film and/or ringing in a circuit.

A peak value of the surge voltage generated against the power transistor is as high as some hundred volts, and a pulse width thereof at the peak is as short as some tens of nanoseconds. Therefore, it is difficult to detect the peak value of the surge voltage only by the existing sample-and-hold circuit 116, whose circuit configuration is shown in FIG. 1.

According to the present embodiment, it is possible to maintain the peak value of the surge voltage for a certain time period due to rectification action by the diode 111 and to reduce the peak value of the surge voltage through capacitive-division by the capacitors 113 and 114, so as to detect the peak value of the surge voltage. Thus, it is possible to provide a surge-voltage detection circuit capable of detecting a peak value of a surge voltage generated against a power transistor, which surge voltage is high and lasts for a short time period. Furthermore, according to the present embodiment, it is possible to provide a surge-voltage detection circuit having a simple configuration that can be incorporated in a power converting device such as an inverter circuit. This will be described in detail below.

In a steady state, a voltage at position Y in FIG. 1 is fixed at a voltage of the positive pole 30a of the direct-current power source 30 via the input terminal A. The following will describe, as an example, a case where the voltage of the positive pole 30a of the direct-current power source 30 is 400 V.

In a steady state, a voltage at position Z in FIG. 1, i.e., a position between the capacitors 113 and 114 is reset to a voltage of the negative pole 30b of the direct-current power source 30. The resetting of the voltage can be performed by short-circuiting position Z to the negative pole 30b of the direct-current power source 30 via the switching element 115 and the input terminal B. The following will describe, as an example, a case where the voltage of the negative pole 30b of the direct-current power source 30 is 0 V.

Figure 3:
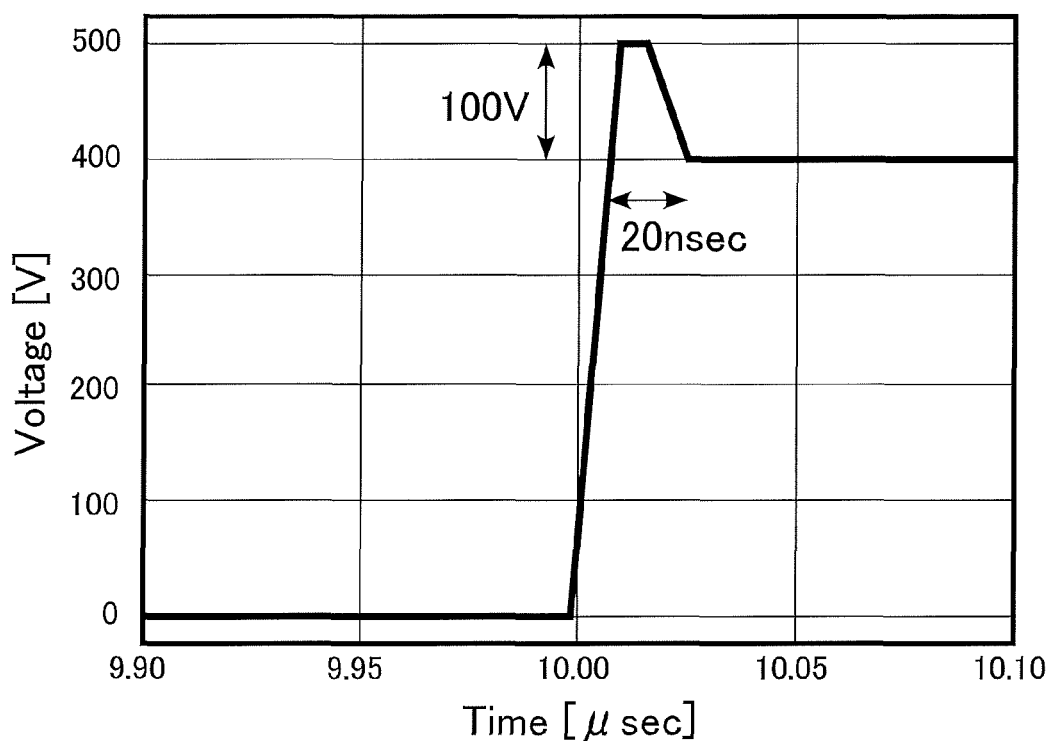
FIG. 3 is a view showing one example of a waveform of a surge voltage.

FIG. 3 is a view showing one example of a waveform of a surge voltage that may be generated at position X in FIG. 1. As shown in FIG. 3, a peak value of the surge voltage is, e.g., 100 V, and a pulse width thereof at the peak is, e.g., 20 nanoseconds.

When a surge voltage having a peak value of 100 V is generated at position X, a voltage at position Y is also increased by 100 V via the diode 111, so that the voltage at position Y becomes 500 V. Even after the surge voltage at position X calms down and the voltage at position X returns to 400 V, the voltage at position Y is maintained due to rectification action of the diode 111 for a certain time period at 500 V, to which the value of the surge voltage has been added. This gives a time allowance, thereby making it easier to detect the surge voltage.

The voltage at position Z in FIG. 1 is subjected to capacitive-division by the capacitors 113 and 114, so as to be reduced to a voltage lower than 500 V. Particularly in a steady state, since the voltage at position Z is reset to 0 V, the voltage at position Z is a voltage resulting from capacitive-division only on the increased amount (=100 V) due to the surge voltage. Thus, the peak value of the surge voltage to be detected is reduced. This makes it easier to detect the peak value. Furthermore, a signal-to-noise (S/N) ratio in detection of the surge voltage is improved.

Due to the voltage at position Y maintained for a certain time period, the voltage at position Z is maintained for a certain time period. In addition, by adjusting a capacity ratio between the capacitors 113 and 114, it is possible to significantly reduce the voltage at position Z from the peak value of the surge voltage. Therefore, it is possible to detect the voltage by the existing sample-and-hold circuit 116. The voltage outputted from the sample-and-hold circuit 116 is detected by the detection terminal D.

Figure 4:
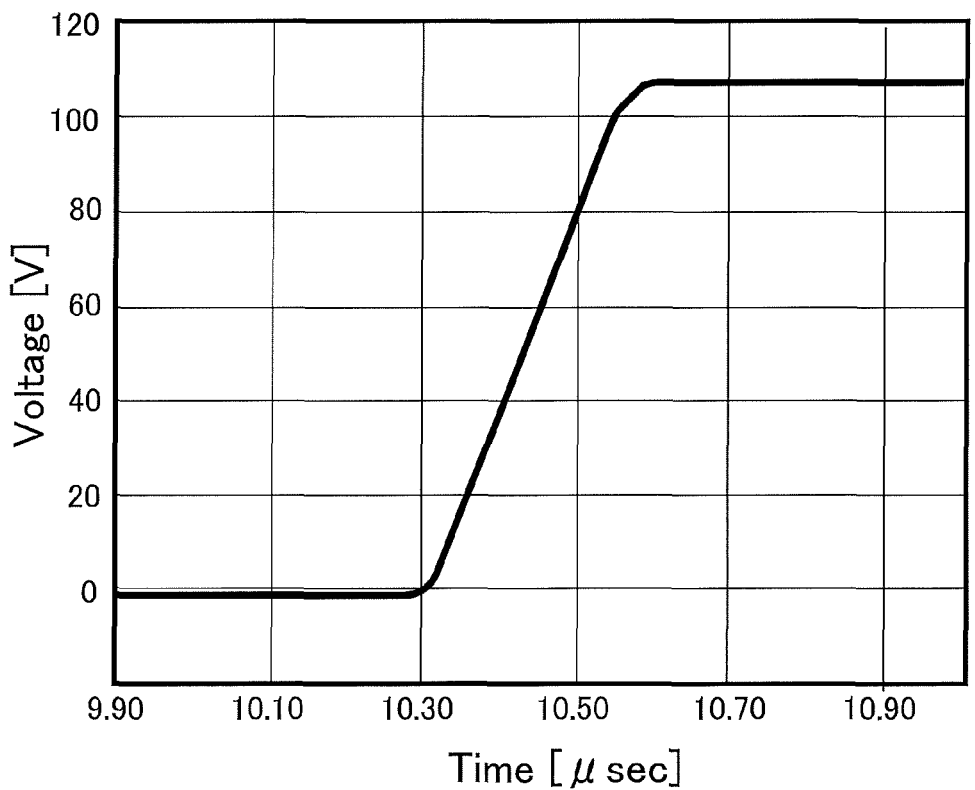
FIG. 4 is a view showing characteristics of surge voltage detection of the semiconductor device according to the first embodiment.

FIG. 4 is a view showing characteristics of surge voltage detection of the semiconductor device according to the present embodiment. FIG. 4 shows a simulation result of a voltage detected by the detection terminal D when the surge voltage having the waveform shown in FIG. 3 is inputted to position X in FIG. 1. FIG. 4 shows a voltage obtained by correcting the detected voltage for the gain of the surge-voltage detection circuit 110.

As is clear from FIG. 4, it is possible to detect 100 V, which is the peak value of the surge voltage, by the surge-voltage detection circuit 110.

The peak value of the surge voltage detected by the detection terminal D can be used to generate an alarm signal, for example. Also, the peak value of the surge voltage detected by the detection terminal D can be used to turn off the low-side transistor 10 and the high-side transistor 20 of the inverter circuit 210, for example.

After the peak value of the surge voltage is detected, the voltage at position Y returns to 400 V of the steady state, since the electric resistor 112 is electrically connected to the positive pole 30a of the direct-current power source 30. The voltage at position Z is caused to return to 0 V by turning on the switching element 115. The voltage at the detection terminal D is caused to return to 0 V by turning on the switching element 117.

A parasitic capacitance of the diode 111 is low. This minimizes an increase of the loss of the inverter circuit 210 caused by provision of the surge-voltage detection circuit 110.

In order to adequately reduce the voltage at position Y, a capacitance of the capacitor 114 is preferably greater than a capacitance of the capacitor 113. In order to adequately reduce the voltage at position Y, the capacitance of the capacitor 114 is preferably ten times or more the capacitance of the capacitor 113.

(Modification)

Figure 5:
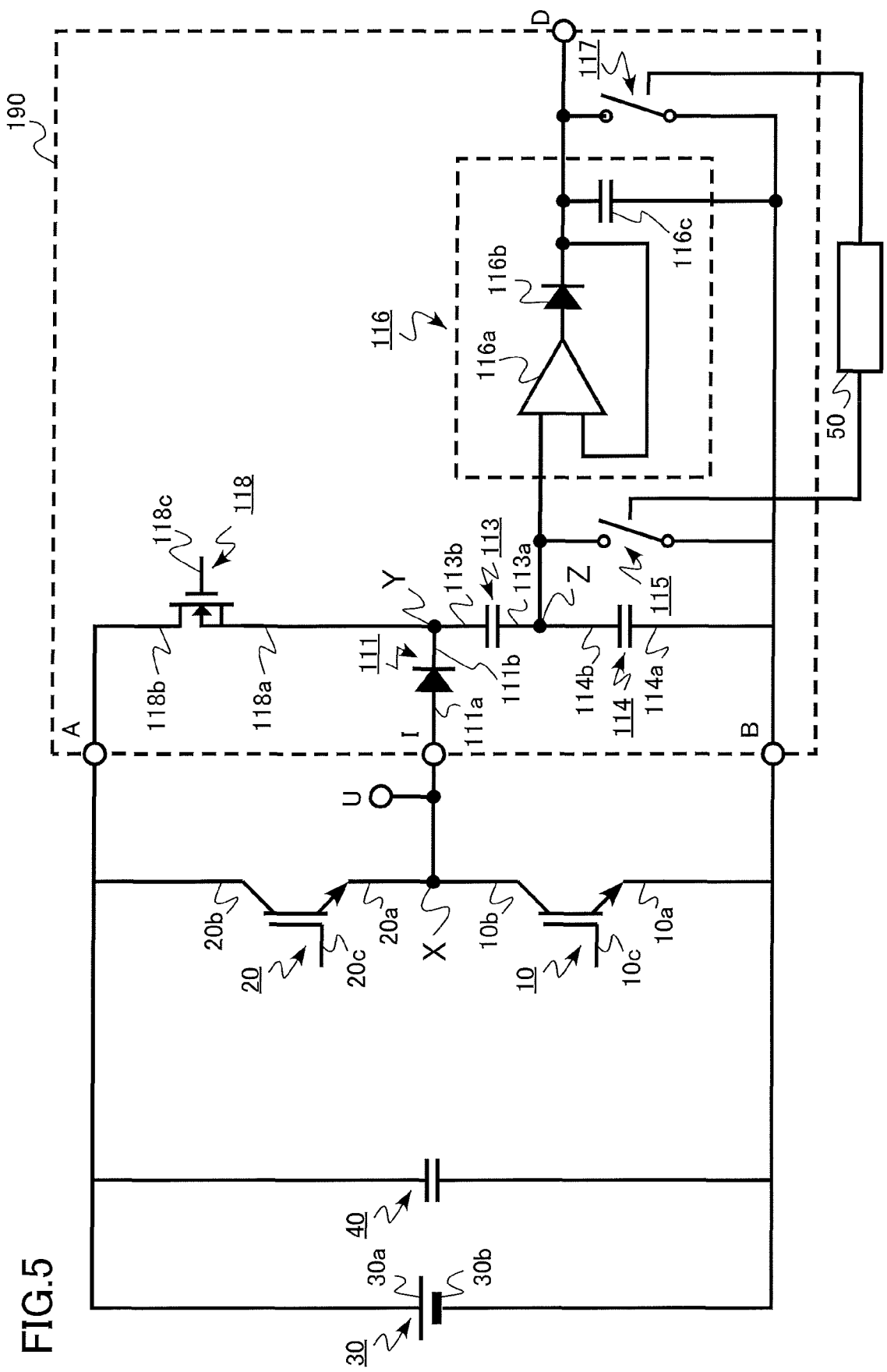
FIG. 5 is a circuit diagram of a semiconductor device according to a modification of the first embodiment.

FIG. 5 is a circuit diagram of a semiconductor device according to a modification of the present embodiment. The semiconductor device according to the modification is a surge-voltage detection circuit 190. The semiconductor device according to the modification includes a metal oxide semiconductor field effect transistor (MOSFET) 118 instead of the electric resistor 112. In terms of this, the semiconductor device according to the modification is different from the semiconductor device according to the embodiment shown in FIG. 1. The MOSFET 118 is one example of the first switching element.

The MOSFET 118 has a source electrode 118a (first one end), a drain electrode 118b (first other end), and a gate electrode 118c. Controlling the voltage applied to the gate electrode 118c switches on/off of the MOSFET 118, which functions as a switching element.

Employing the MOSFET 118 as the first switching element enables quick reset operation.

As described above, according to the present embodiment and the modification thereof, it is possible to provide a surge-voltage detection circuit capable of detecting a peak value of a surge voltage generated against a power transistor, which surge voltage is high and lasts for a short time period. Furthermore, it is possible to provide a surge-voltage detection circuit having a simple configuration that can be incorporated in a power converting device such as an inverter circuit. Moreover, it is possible to provide an inverter circuit including a surge-voltage detection circuit capable of detecting a peak value of a surge voltage.

Second Embodiment

A power converting device according to the present embodiment further includes: a variable resistor electrically connected to the first gate electrode of the first transistor; and a controller configured to control a resistance value of the variable resistor based on a voltage value of the second one end of the first capacitor. In terms of this, the power converting device according to the present embodiment is different from the power source driving circuit according to the first embodiment. In the following description, explanations of the overlapping contents with the first embodiment are omitted.

Figure 6:
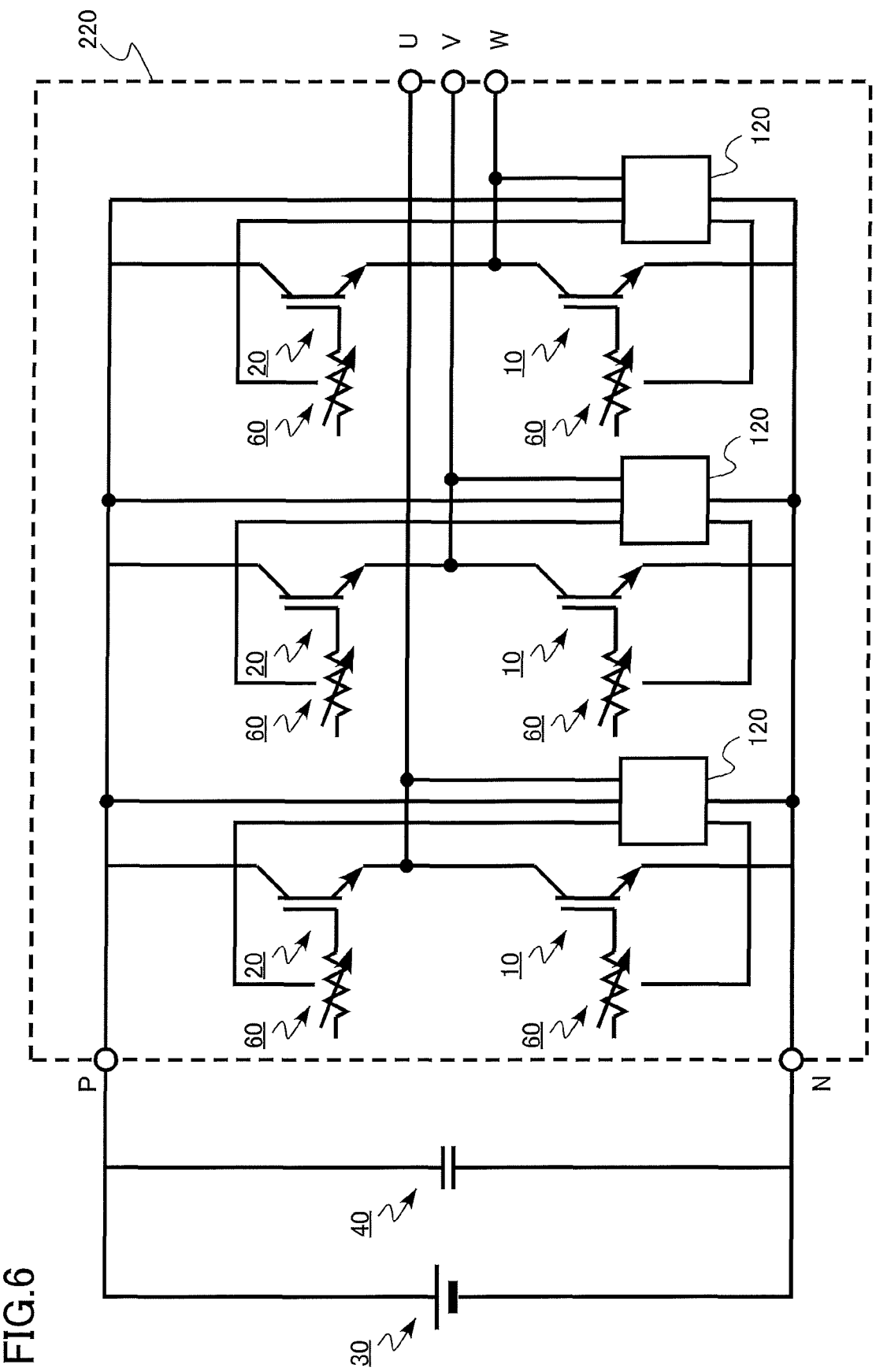
FIG. 6 is a circuit diagram of a power converting device according to a second embodiment.
Figure 7:
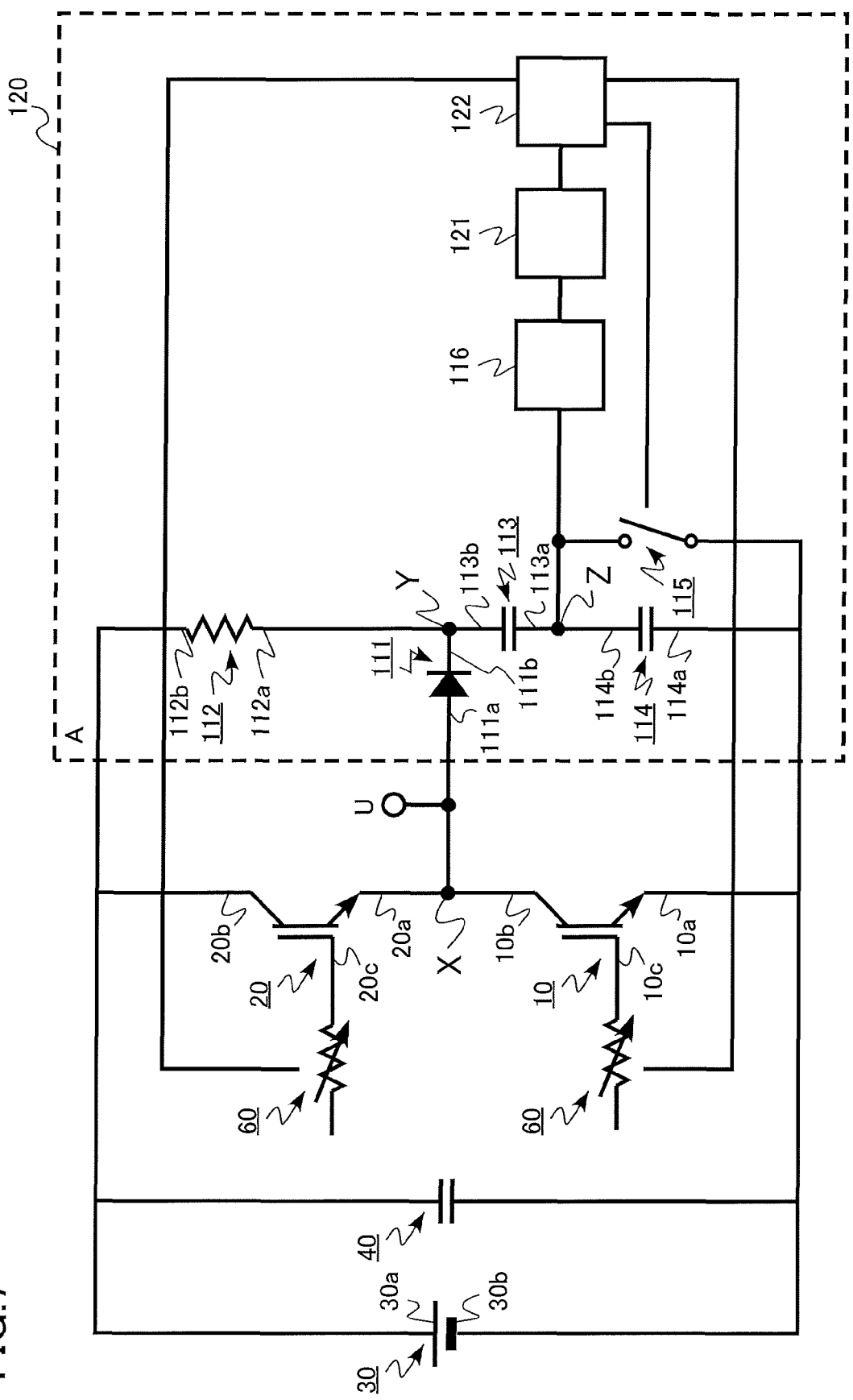
FIG. 7 is a circuit diagram of a semiconductor device according to the second embodiment.

FIG. 6 is a circuit diagram of a power converting device according to the present embodiment. The power converting device according to the present embodiment is an inverter circuit 220 including surge-voltage detection circuits 120. FIG. 7 is a view showing a part of the power converting device according to the present embodiment.

FIG. 7 is a circuit diagram of a semiconductor device according to the present embodiment. FIG. 7 shows details of a configuration of one of the surge-voltage detection circuits 120.

The inverter circuit 220 according to the present embodiment provides so-called active gate control, by which a gate voltage of the power transistor is actively controlled.

The inverter circuit 220 includes variable resistors 60. One of the variable resistors 60 is electrically connected to a gate electrode 10c (first gate electrode) of a low-side transistor 10 (first transistor), and another of the variable resistors 60 is electrically connected to a gate electrode 20c of a high-side transistor 20.

The surge-voltage detection circuit 120 includes a sample-and-hold circuit 116, an analog-to-digital converter 121, and a microcomputer 122 (controller).

A voltage value of an end 113a (second one end) of a capacitor 113 (first capacitor), i.e., a voltage value at position Z is inputted to the microcomputer 122 via the sample-and-hold circuit 116 and the analog-to-digital converter 121. The voltage value may be a difference between a potential value of the position Z and a potential value of a ground.

The voltage value at position Z is based on a peak value of a surge voltage. Based on the peak value of the surge voltage worked out from the voltage value at position Z, the microcomputer 122 outputs an instruction to change resistance values of the variable resistors 60. Consequently, gate charging/discharging currents of the low-side transistor 10 and the high-side transistor 20 are changed. Thus, the inverter circuit 220 is controlled so that the surge voltage becomes a predetermined voltage value or less.

There is no limitation on the configuration of the variable resistor 60, as long as a resistance thereof is variable. For example, the variable resistor 60 is a MOSFET that performs analog operation. In response to the instruction from the microcomputer 122, for example, a gate voltage of the MOSFET changes, and thus a resistance changes. Alternatively, for example, the variable resistor 60 is a plurality of MOSFETs connected in parallel. By changing the number of MOSFETs that are in an on-state and an off-state, a resistance is changed.

Turning on/off of the switching element 115 is also controlled by an instruction from the microcomputer 122.

As described above, according to the present embodiment, it is possible to provide an inverter circuit capable of suppressing a surge voltage by actively controlling a gate voltage of a power transistor with use of a surge-voltage detection circuit.

Third Embodiment

In a semiconductor device according to the present embodiment, the second switching element is a second transistor having a third electrode, a fourth electrode, and a second gate electrode, the third electrode being electrically connected to a negative pole, the fourth electrode being electrically connected to the third other end of the second capacitor. In terms of this, the semiconductor device according to the present embodiment is different from the first embodiment. Furthermore, the semiconductor device according to the present embodiment further includes: a third capacitor having fourth one end and fourth other end, the fourth one end being electrically connected to the third electrode, the fourth other end being electrically connected to the second gate electrode; a second resistor having fifth one end and fifth other end, the fifth one end being electrically connected to the fourth one end of the third capacitor, the fifth other end being electrically connected to the fourth other end of the third capacitor; and a third electric resistor having sixth one end and sixth other end, the sixth one end being electrically connected to the fifth other end of the second electric resistor, the sixth other end being electrically connected to the first anode. In terms of this, the semiconductor device according to the present embodiment is different from the first embodiment. In the following description, explanations of the overlapping contents with the first embodiment are omitted.

Figure 8:
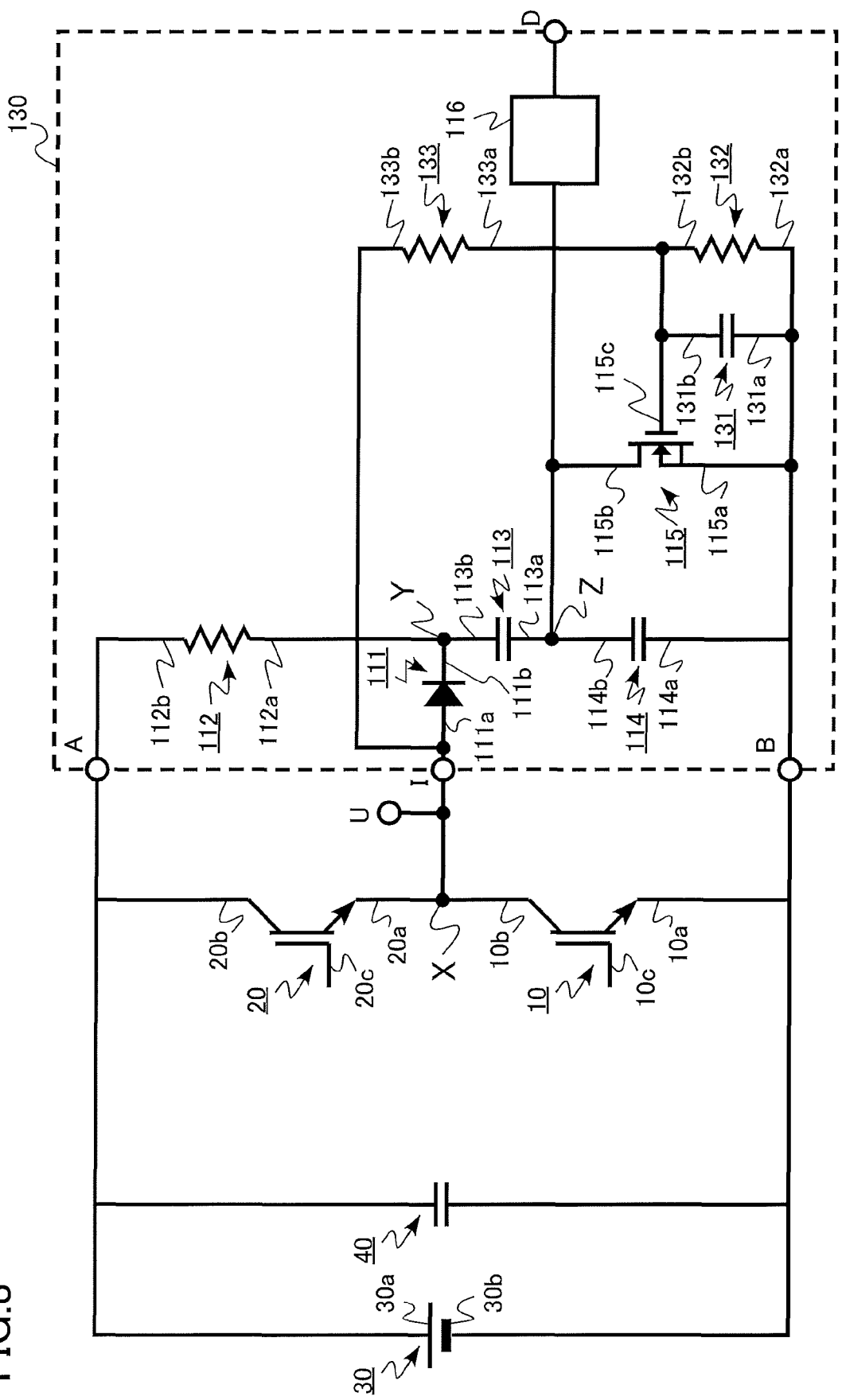
FIG. 8 is a circuit diagram of a semiconductor device according to a third embodiment.

FIG. 8 is a circuit diagram of a semiconductor device according to the present embodiment. The semiconductor device according to the present embodiment is a surge-voltage detection circuit 130.

The surge-voltage detection circuit 130 includes a diode 111 (first diode), an electric resistor 112 (first electric resistor), a capacitor 113 (first capacitor), a capacitor 114 (second capacitor), a switching element 115 (second switching element), a sample-and-hold circuit 116, an input terminal A, an input terminal B, an input terminal I, a detection terminal D, a capacitor 131 (third capacitor), an electric resistor 132 (second electric resistor), and an electric resistor 133 (third electric resistor).

The switching element 115 is a MOSFET. The MOSFET has a source electrode 115a (third electrode), a drain electrode 115b (fourth electrode), and a gate electrode 115c (second gate electrode). The source electrode 115a is electrically connected to a negative pole 30b of a direct-current power source 30 via the input terminal B. The drain electrode 115b is electrically connected to an end 114b of the capacitor 114.

The capacitor 131 has an end 131a (fourth one end) and an end 131b (fourth other end). The end 131a is electrically connected to the source electrode 115a. The end 131b is electrically connected to the gate electrode 115c.

The electric resistor 132 has an end 132a (fifth one end) and an end 132b (fifth other end). The end 132a is electrically connected to the end 131a of the capacitor 131. The end 132b is electrically connected to the end 131b of the capacitor 131.

The electric resistor 133 has an end 133a (sixth one end) and an end 133b (sixth other end). The end 133a is electrically connected to the end 132b of the electric resistor 132. The end 133b is electrically connected to an anode 111a of the diode 111.

When a surge voltage is generated at position X in FIG. 8, the surge voltage is subjected to resistance division by the electric resistors 132 and 133, and a resultant is supplied to the capacitor 131 and the gate electrode 115c. Following detection of a peak value of the surge voltage by the detection terminal D, the switching element 115 is automatically turned on after being delayed for a predetermined time period, so that the voltage at position Z is reset to 0 V. After that, the voltage of the gate electrode 115c drops, and accordingly the switching element 115 is automatically turned off.

According to the present embodiment, as well as in the first embodiment, it is possible to provide a surge-voltage detection circuit capable of detecting a peak value of a surge voltage generated against a power transistor, which surge voltage is high and lasts for a short time period. Furthermore, it is possible to provide a surge-voltage detection circuit having a simple configuration that can be incorporated in a power converting device such as an inverter circuit. Moreover, the present embodiment enables automatic reset of the surge-voltage detection circuit.

Fourth Embodiment

A semiconductor device according to the present embodiment further includes a fifth capacitor electrically connected between a first anode and a third electric resistor. In terms of this, the semiconductor device according to the present embodiment is different from the third embodiment. In the following description, explanations of the overlapping contents with the third embodiment are omitted.

Figure 9:
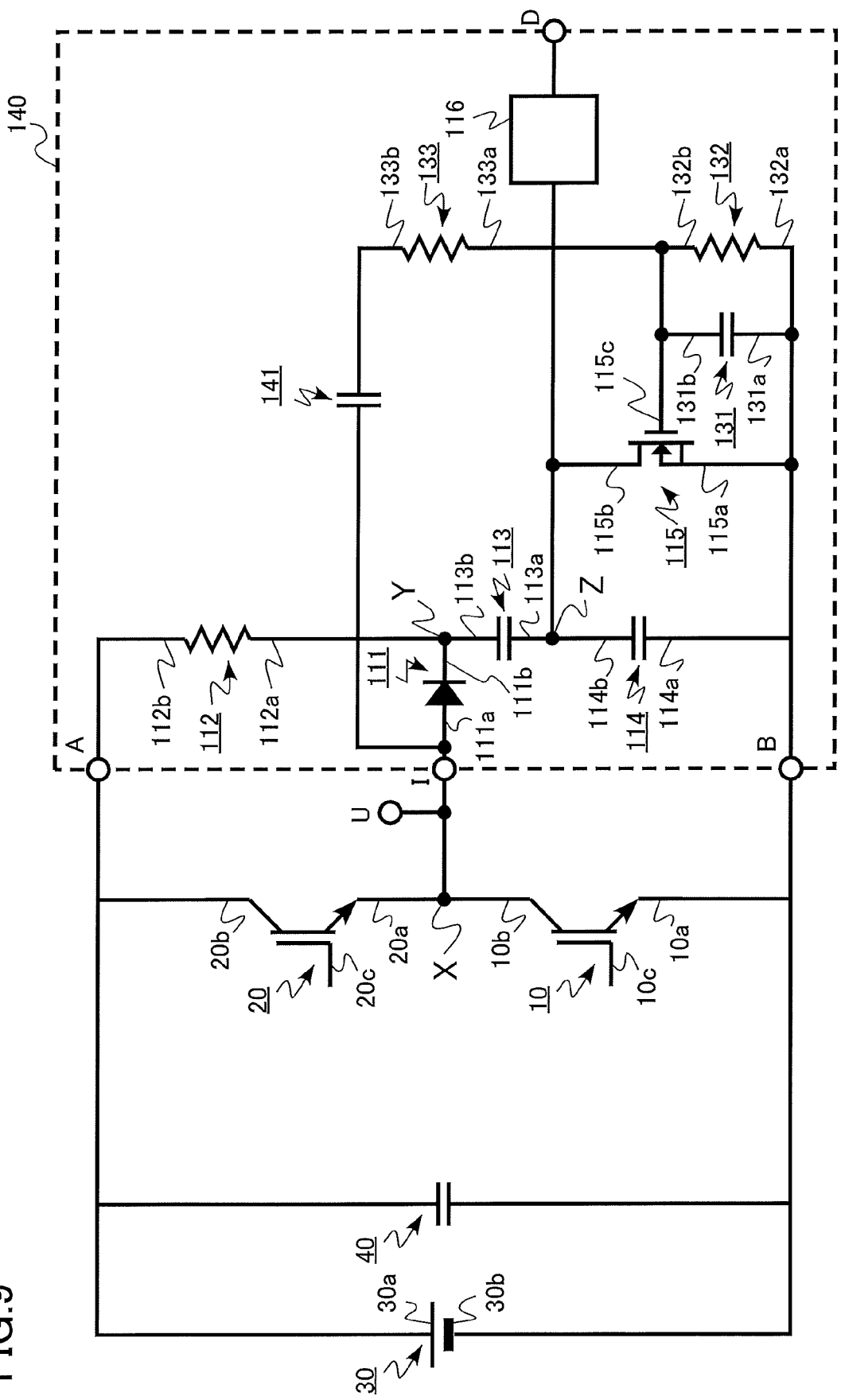
FIG. 9 is a circuit diagram of a semiconductor device according to a fourth embodiment.

FIG. 9 is a circuit diagram of a semiconductor device according to the present embodiment. The semiconductor device according to the present embodiment is a surge-voltage detection circuit 140.

The surge-voltage detection circuit 140 includes a diode 111 (first diode), an electric resistor 112 (first electric resistor), a capacitor 113 (first capacitor), a capacitor 114 (second capacitor), a switching element 115 (second switching element), a sample-and-hold circuit 116, an input terminal A, an input terminal B, an input terminal I, a detection terminal D, a capacitor 131 (third capacitor), an electric resistor 132 (second electric resistor), an electric resistor 133 (third electric resistor), and a capacitor 141 (fifth capacitor).

The capacitor 141 is electrically connected between an anode 111a of the diode 111 and the electric resistor 133.

As well as the third embodiment, the present embodiment enables automatic reset of a surge-voltage detection circuit. Furthermore, since a direct current component of a surge voltage is interrupted by the capacitor 141, a loss of a power converting device and the like caused by addition of the surge-voltage detection circuit 140 is reduced in the present embodiment, as compared to the third embodiment.

Fifth Embodiment

A semiconductor device according to the present embodiment further includes: a second diode having a second anode and a second cathode, the second anode being electrically connected to the fourth other end of the third capacitor, the second cathode being electrically connected to the first anode, the second diode being electrically connected parallel to the third electric resistor and the fifth capacitor. In terms of this, the semiconductor device according to the present embodiment is different from the fourth embodiment. In the following description, explanations of the overlapping contents with the fourth embodiment are omitted.

Figure 10:
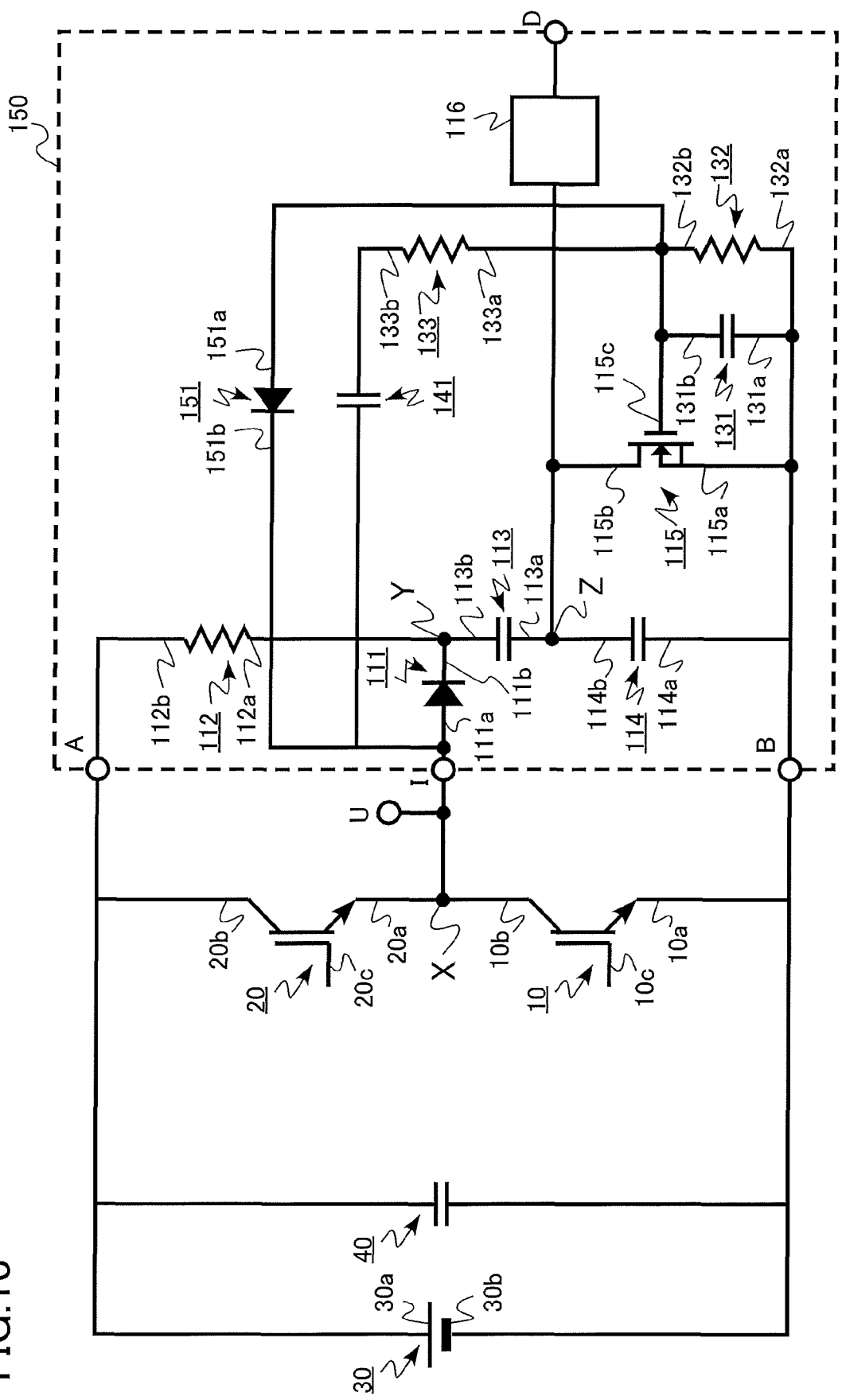
FIG. 10 is a circuit diagram of a semiconductor device according to a fifth embodiment.

FIG. 10 is a circuit diagram of a semiconductor device according to the present embodiment. The semiconductor device according to the present embodiment is a surge-voltage detection circuit 150.

The surge-voltage detection circuit 150 includes a diode 111 (first diode), an electric resistor 112 (first electric resistor), a capacitor 113 (first capacitor), a capacitor 114 (second capacitor), a switching element 115 (second switching element), a sample-and-hold circuit 116, an input terminal A, an input terminal B, an input terminal I, a detection terminal D, a capacitor 131 (third capacitor), an electric resistor 132 (second electric resistor), an electric resistor 133 (third electric resistor), a capacitor 141 (fifth capacitor), and a diode 151 (second diode).

The diode 151 has an anode 151a (second anode) and a cathode 151b (second cathode). The anode 151a is electrically connected to an end 131b of the capacitor 131. The cathode 151b is electrically connected to an anode 111a of the diode 111. The diode 151 is provided in electrically parallel to the electric resistor 133 and the capacitor 141.

As well as the fourth embodiment, the present embodiment enables automatic reset of a surge-voltage detection circuit. Furthermore, since the present embodiment includes the diode 151, the switching element 115 turns off more quickly in the present embodiment, as compared to the fourth embodiment.

Sixth Embodiment

A driving device according to the present embodiment is a driving device including the power converting device according to the first embodiment.

Figure 11:
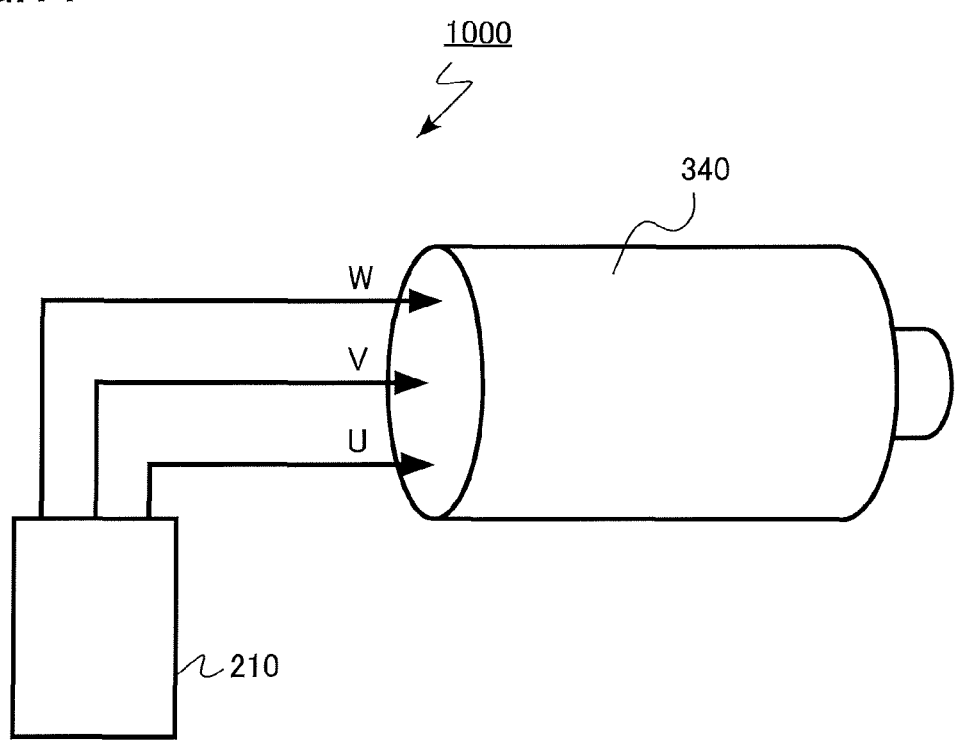
FIG. 11 is a schematic diagram of a driving device according to a sixth embodiment.

FIG. 11 is a schematic diagram of a driving device according to the present embodiment. A driving device 1000 includes a motor 340 and an inverter circuit 210. The motor 340 is driven by an alternating-current voltage outputted from the inverter circuit 210.

According to the present embodiment, the characteristics of the driving device 1000 are improved, since the present embodiment includes the inverter circuit 210 capable of detecting a surge voltage.

Seventh Embodiment

A vehicle according to the present embodiment is a vehicle including the power converting device according to the first embodiment.

Figure 12:
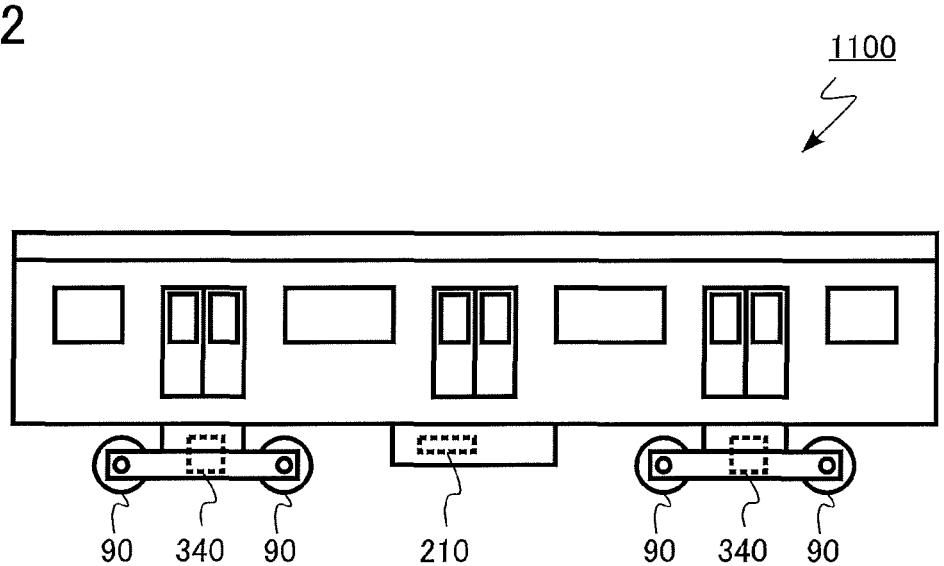
FIG. 12 is a schematic diagram of a vehicle according to a seventh embodiment.

FIG. 12 is a schematic diagram of a vehicle according to the present embodiment. A vehicle 1100 according to the present embodiment is a railway vehicle. The vehicle 1100 includes a motor 340 and an inverter circuit 210.

The motor 340 is driven by an alternating-current voltage outputted from the inverter circuit 210. A wheel 90 of the vehicle 1100 is rotated by the motor 340.

According to the present embodiment, the characteristics of the vehicle 1100 are improved, since the present embodiment includes the inverter circuit 210 capable of detecting a surge voltage.

Eighth Embodiment

A vehicle according to the present embodiment is a vehicle including the power converting device according to the first embodiment.

Figure 13:
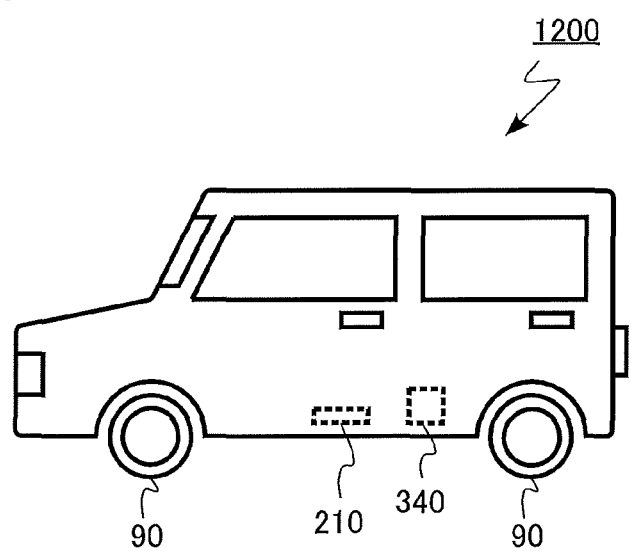
FIG. 13 is a schematic diagram of a vehicle according to an eighth embodiment.

FIG. 13 is a schematic diagram of a vehicle according to the present embodiment. A vehicle 1200 according to the present embodiment is an automobile. The vehicle 1200 includes a motor 340 and an inverter circuit 210.

The motor 340 is driven by an alternating-current voltage outputted from the inverter circuit 210. A wheel 90 of the vehicle 1200 is rotated by the motor 340.

According to the present embodiment, the characteristics of the vehicle 1200 are improved, since the present embodiment includes the inverter circuit 210 capable of detecting a surge voltage.

Ninth Embodiment

An elevator according to the present embodiment is an elevator including the power converting device according to the first embodiment.

Figure 14:
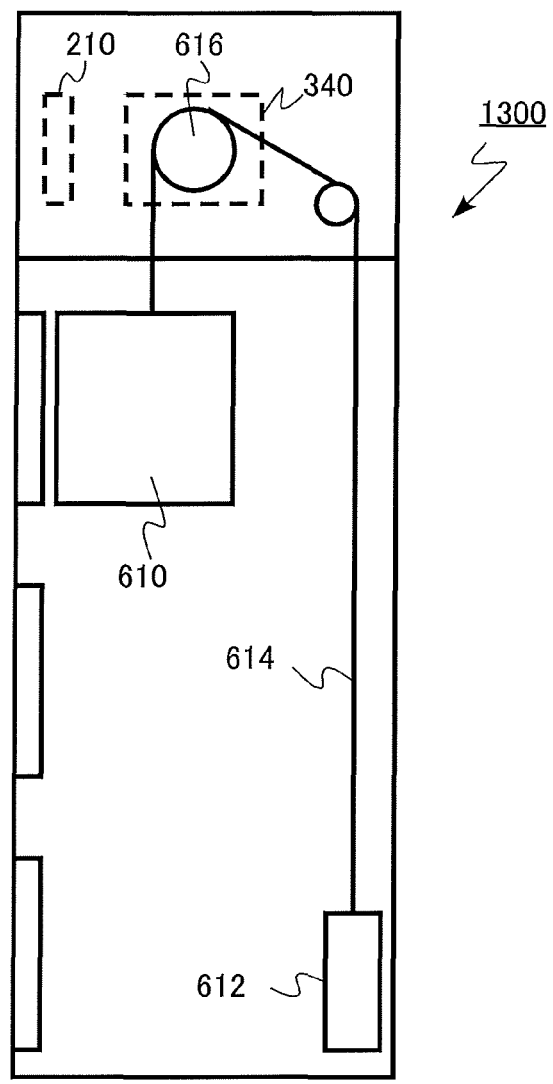
FIG. 14 is a schematic diagram of an elevator according to a ninth embodiment.

FIG. 14 is a schematic diagram of an elevator (lift) according to the present embodiment. An elevator 1300 according to the present embodiment includes a car 610, a counterweight 612, a wire rope 614, a hoisting machine 616, a motor 340, and an inverter circuit 210.

The motor 340 is driven by an alternating-current voltage outputted from the inverter circuit 210. The hoisting machine 616 is rotated by the motor 340, so that the car 610 moves up and down.

According to the present embodiment, the characteristics of the elevator 1300 are improved, since the present embodiment includes the inverter circuit 210 capable of detecting a surge voltage.

The first to fifth embodiments and the modification have dealt with the inverter circuit as an example of the power converting device. Alternatively, however, a DC-DC converter can be employed as the power converting device. In addition, the foregoing has explained, as an example, a case where a surge voltage generated against the transistor of the power converting device is detected by the surge-voltage detection circuit. Alternatively, however, the surge-voltage detection circuits according to the embodiments and the modification can be applied to detect a surge voltage generated against a transistor used in devices other than the power converting device.

The sixth to ninth embodiments have dealt with, as examples, the cases where the semiconductor device and the power converting device according to the present disclosure are applied to the driving device, the vehicle, or the elevator. Alternatively, however, the semiconductor device and the power converting device according to the present disclosure can be applied to, for example, a power conditioner of a photovoltaic power generating system.

While certain embodiments have been described, these embodiments have been presented byway of example only, and are not intended to limit the scope of the inventions. Indeed, a semiconductor device, a power converting device, a driving device, a vehicle, and an elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
    a first diode having a first anode and a first cathode, the first anode being electrically connected to either one of a first electrode and a second electrode of a first transistor having the first electrode, the second electrode, and a first gate electrode;
    a first electric resistor or a first switching element having a first one end and a first other end, the first one end being electrically connected to the first cathode, the first other end being electrically connected to a positive pole of a direct-current power source having the positive pole and a negative pole;
    a first capacitor having a second one end and a second other end, the second other end being electrically connected to the first cathode;
    a second capacitor having a third one end and a third other end, the third one end being electrically connected to the negative pole, the third other end being electrically connected to the second one end of the first capacitor; and
    a second switching element electrically connected between the third one end and the third other end of the second capacitor in parallel to the second capacitor.

2. The semiconductor device according to claim 1, further comprising a sample-and-hold circuit electrically connected to the second one end of the first capacitor.

3. The semiconductor device according to claim 1, wherein a capacitance of the second capacitor is greater than a capacitance of the first capacitor.

4. The semiconductor device according to claim 1, wherein a capacitance of the second capacitor is ten times or more a capacitance of the first capacitor.

5. The semiconductor device according to claim 1, wherein the second switching element is a second transistor having a third electrode, a fourth electrode, and a second gate electrode, the third electrode being electrically connected to the negative pole, the fourth electrode being electrically connected to the third other end of the second capacitor.

6. The semiconductor device according to claim 5, further comprising:
    a third capacitor having a fourth one end and a fourth other end, the fourth one end being electrically connected to the third electrode, the fourth other end being electrically connected to the second gate electrode;
    a second resistor having a fifth one end and a fifth other end, the fifth one end being electrically connected to the fourth one end of the third capacitor, the fifth other end being electrically connected to the fourth other end of the third capacitor; and
    a third electric resistor having a sixth one end and a sixth other end, the sixth one end being electrically connected to the fifth other end of the second electric resistor, the sixth other end being electrically connected to the first anode.

7. The semiconductor device according to claim 6, further comprising a fifth capacitor being electrically connected between the first anode and the third electric resistor.

8. The semiconductor device according to claim 7, further comprising a second diode having a second anode and a second cathode, the second anode being electrically connected to the fourth other end of the third capacitor, the second cathode being electrically connected to the first anode, the second diode being electrically connected parallel to the third electric resistor and the fifth capacitor.

9. A power converting device comprising:
a first transistor having a first electrode, a second electrode, and a first gate electrode;
a first diode having a first anode and a first cathode, the first anode being electrically connected to either one of the first electrode and the second electrode;
a first electric resistor or a first switching element having a first one end and a first other end, the first one end being electrically connected to the first cathode, the first other end being electrically connected to a positive pole of a direct-current power source having the positive pole and a negative pole;
a first capacitor having a second one end and a second other end, the second other end being electrically connected to the first cathode;
a second capacitor having a third one end and a third other end, the third one end being electrically connected to the negative pole, the third other end being electrically connected to the second one end of the first capacitor; and
a second switching element electrically connected between the third one end and the third other end of the second capacitor in parallel to the second capacitor.

10. The power converting device according to claim 9, further comprising:
a variable resistor electrically connected to the first gate electrode of the first transistor; and
a controller configured to control a resistance value of the variable resistor based on a voltage value of the second one end of the first capacitor.

11. The power converting device according to claim 10, further comprising: a sample-and-hold circuit electrically connected to the second one end of the first capacitor, wherein
the controller controls the resistance value of the variable resistor based on a voltage value outputted from the sample-and-hold circuit.

12. The power converting device according to claim 9, wherein a capacitance of the second capacitor is greater than a capacitance of the first capacitor.

13. The power converting device according to claim 9, wherein a capacitance of the second capacitor is ten times or more a capacitance of the first capacitor.

14. A driving device comprising the power converting device according to claim 9.

15. A vehicle comprising the power converting device according to claim 9.

16. An elevator comprising the power converting device according to claim 9.

* * * * *